(12) United States Patent
Shacham et al.

(10) Patent No.: US 6,493,840 B1
(45) Date of Patent: Dec. 10, 2002

(54) TESTABILITY ARCHITECTURE FOR MODULARIZED INTEGRATED CIRCUITS

(75) Inventors: Alon Shacham, Tel-Aviv (IL); Peleg Lior, Rishon Le-Zion (IL); Rami Saban, Holon (IL); Yomtov Sidl, Nes-Ziona (IL)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/433,611

(22) Filed: Nov. 2, 1999

Related U.S. Application Data

(62) Division of application No. 08/799,676, filed on Feb. 11, 1997, now Pat. No. 6,060,897.

(51) Int. Cl.[7] .......................... G01R 31/28; G01R 31/08
(52) U.S. Cl. ........................................ 714/724; 370/242
(58) Field of Search .............................. 714/734, 733, 714/724, 725, 10, 11, 12, 742, 4, 25; 370/242, 241, 245; 324/158.1, 763, 765

(56) References Cited

U.S. PATENT DOCUMENTS

| | | | |
|---|---|---|---|
| 4,860,290 A | * 8/1989 | Daniels et al. | 714/726 |
| 5,389,556 A | 2/1995 | Rostoker et al. | 438/17 |
| 5,404,584 A | 4/1995 | Bobbitt et al. | 455/115 |
| 5,432,441 A | 7/1995 | El-Ayat et al. | 324/158.1 |
| 5,517,515 A | 5/1996 | Spall et al. | 371/22.5 |
| 5,570,035 A | 10/1996 | Dukes et al. | 324/763 |
| 5,604,432 A | * 2/1997 | Moore et al. | 324/158.1 |
| 6,272,656 B1 | * 8/2001 | Yoshiyama | 714/733 |
| 6,324,662 B1 | * 11/2001 | Haroun et al. | 714/724 |

* cited by examiner

Primary Examiner—Christine T. Tu
(74) Attorney, Agent, or Firm—Skjerven Morrill LLP; Norman R. Klivans

(57) ABSTRACT

A testability architecture and method for loosely integrated (modularized) integrated circuits uses stand alone module testing. For an integrated circuit chip which has a number of independent modules, where one module design is used in a number of different chips, each module is connected to the chip's input/output pins and to a configuration module. To make testing of the modules more efficient and less expensive, during testing of the chip a particular module design is confronted with the same testing environment regardless of the actual chip in which it is present. Advantageously, chip area is only slightly enlarged by the test circuitry. A test architecture of the configuration module includes test registers and carries out a standard protocol for all read and write transactions during testing. This approach provides better test coverage and economizes in test generation.

9 Claims, 4 Drawing Sheets

TESTABILITY ARCHITECTURE FOR MODULARIZED INTEGRATED CIRCUITS

CROSS-REFERENCE TO RELATED APPLICATION

This application is a divisional of U.S. application Ser. No. 08/799,676, filed Feb. 11, 1997, now U.S. Pat. No. 6,060,897 issued May 9, 2000.

BACKGROUND

1. Field of the Invention

This invention relates to testing of integrated circuits, and to on-chip circuitry for supporting testing of modularized ("loosely integrated") integrated circuits.

2. Background

There are types of chips (integrated circuits), e.g. PC87306, PC87307 or PC87317, where each chip includes several circuit modules that are independent of each other ("loosely integrated"); these modules have no direct interface with one another. Each independent module receives its input signals either from a central configuration module (CFG) or directly from the I/O (input/output) (terminals) pins of the chip. In a similar way, each module's output signals are connected either to the CFG or to the I/O. There is also a clock module whose interface is treated as I/O controlled by the CFG. An example of a module is a block of logic circuitry for performing a particular function; a module can include logic and/or memory. FIG. 1 shows such a chip 10 with modules 1, 2, 3, and 4 and CFG 12, having I/O connections 16 to I/O 18. Each module is provided with I/O connections 20, 22, 24, 26, and connections 30, 32, 34, 36 to the CFG. The CFG 12 also provides I/O control signals for the direction of the I/O, multiplexed functions on one chip pin, etc.

In the prior development (design) process for such chips, one module design is used in various otherwise different chips. However the modules' test vectors (test signals used for testing the chip during production) must be regenerated for each new chip. As a result, the process of generating correct test vectors and testing a new chip is expensive and time consuming.

The main reasons for changing test vectors for a module design used in several different chips are:
1. Changes in the CFG module from chip to chip.
2. Changes in the I/O from chip to chip; these changes require that a particular module design will be connected to different I/O pins in different chips.

Changes in the test vectors necessitate new fault-grading to ensure adequate coverage of the new test program. This lengthy process is seldom done, and the resulting inadequate test coverage results in chip failures.

Since test vectors cannot be used "as is" for new chips, this delays commercial production of the chip, incurs additional cost for the test program development, and causes poor fault coverage of the test program, resulting in chip failures.

SUMMARY

This prior art testing problem is addressed by adding circuits to the CFG and to the I/O portions of a chip, and providing a method to test each module design using these additional circuits, as a "stand alone module" regardless of the actual chip in which that module design is used. Therefore in the test mode, each module design is exposed to the same test pattern, regardless of the chip into which it is integrated. This allows easy integration of the module design in new chips, regardless of the chip CFG module and the I/O pin assignment, and chip area is enlarged only slightly (e.g. 1% or less). Hence there is no need to generate new test vectors and change test programs for an existing "stand alone module". Therefore once a module design has reached an adequate level of fault coverage, there is no need to repeat the test design process for each new chip, because the old test vectors are used.

BRIEF DESCRIPTION OF THE DRAWINGS

FIG. 4A shows a SAMT (Stand Alone Module Testing) module register; FIG. 4B shows a SAMT configuration register.

DETAILED DESCRIPTION

"SAMT" (Stand-Alone Module Testing) refers to testing as described herein. SAMT in one embodiment controls all input signals to the "stand alone" module, and observes all the output signals. SAMT provides for writing tests and generating test vectors as if the module is an independent chip, regardless of the CFG or the current I/O of the actual chip on which the module is located.

After entering SAMT mode, only one "stand alone" module is tested at a time; other modules are disabled; each module has an enable signal controlled by the CFG. The module interface signals are classified into types according to their functionality; these types are:

1. The CFG input type signal is of a configuration nature (i.e. it rarely changes and does not have an immediate effect on the module). In SAMT mode this type of signal is driven from the SAMT registers in the CFG module. (There is no SAMT logic and no SAMT registers in the modules.)
2. The "imm" input type signal is of an "immediate" nature. Usually it is coupled to a chip pin (for example it is a data/address/chip_select signal). In SAMT mode this signal may be driven by a different pin than in normal (operating) mode, and then it comes through the SAMT MUX (multiplexer) logic.
3. The cfg output type signal, whose exact timing is not important, is usually an output signal from a register in the module under test. In SAMT mode, this type of signal is read out in a read transaction.
4. The imm output type signal is an output signal whose exact timing is important and needs constant monitoring. In SAMT mode, signals of this type are coupled to chip pins (examples of these type signals are clock signals or other signals that change frequently). The "imm outputs" are the tested module's output signals. These output signals from the tested module may be coupled to the same chip pin as in normal operation, or to a chip pin that is used by other module in the normal operation. In the second case the output signal is sent to the SAMT MUX logic and from there to the I/O.

For I/O control, in SAMT mode the relevant I/O buffers (e.g. tri-state buffers) are driven into a specific state by the specific module that is under test. Examples of this process are:

1. If a chip pin in normal mode may carry an output signal from either module 1 or module 2, then in SAMT mode when testing module 2, that pin will be driven only by module 2.
2. In SAMT mode, when testing module 1 one may want to drive a module 1 signal on a chip pin that in normal operation (non-test) mode is driven by module 2.

Figure 1:
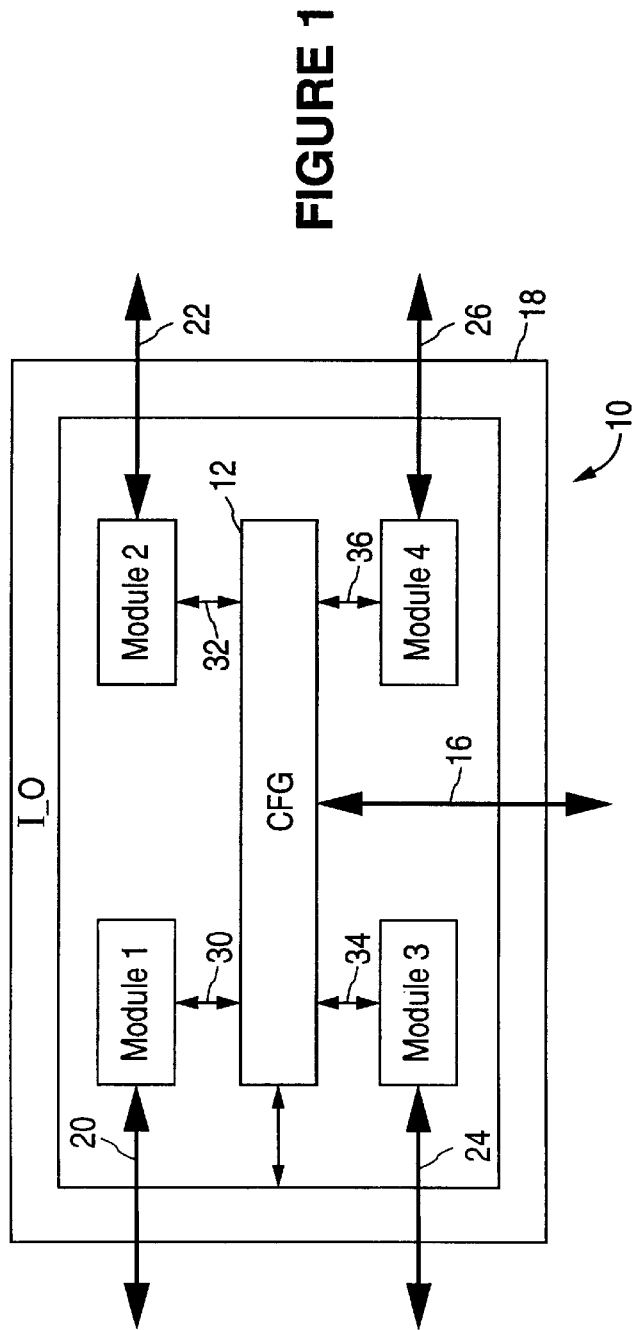
FIG. 1 shows a block diagram of a modularized chip.
Figure 2:
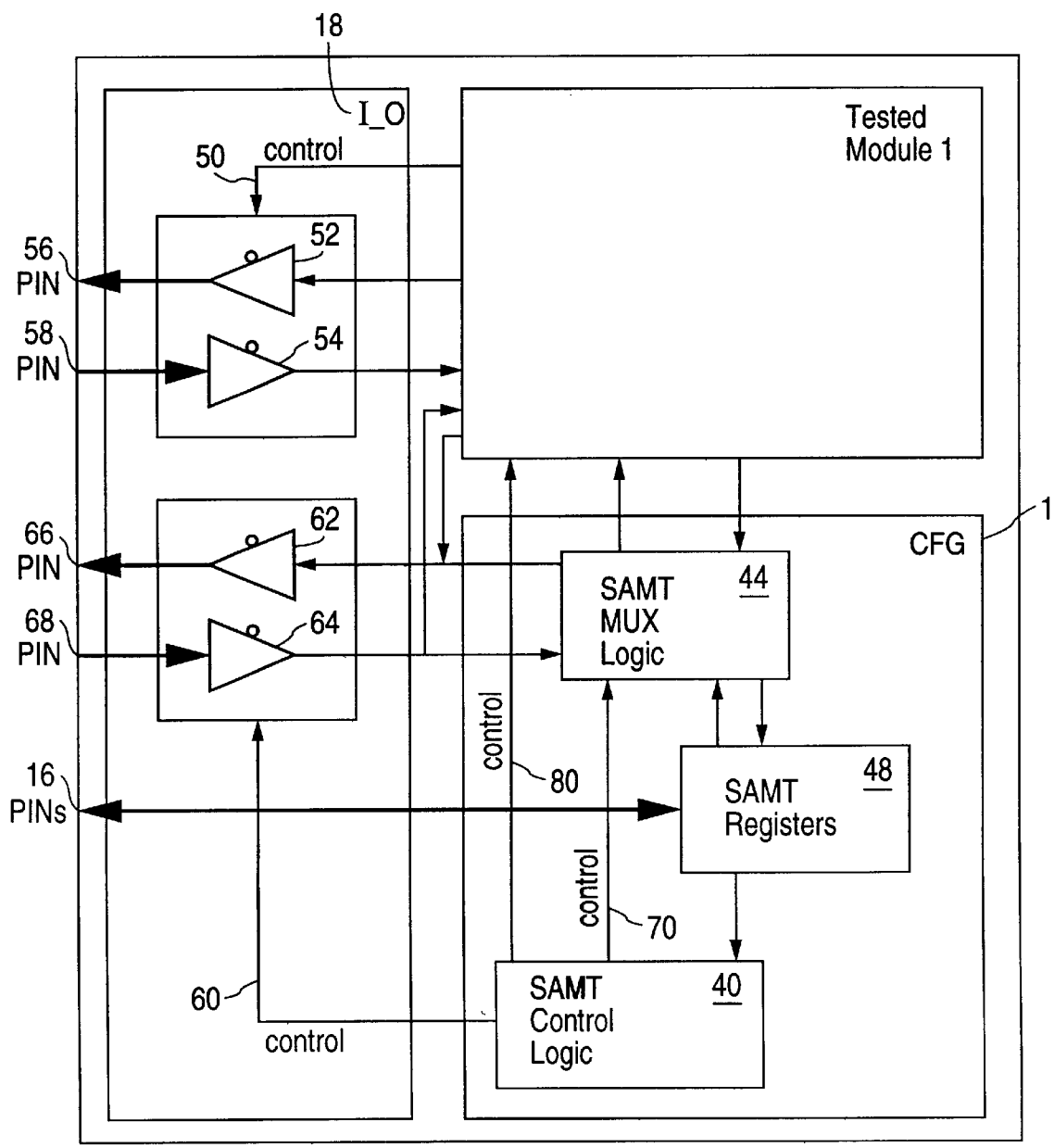
FIG. 2 shows connections to one module of the chip of FIG. 2.

The SAMT part of the CFG architecture is shown schematically in FIG. 2. FIG. 2, showing circuitry in accordance with the invention, shows a portion of the structure of FIG. 1 in greater detail, with similar elements identically labelled. The SAMT part of the CFG 12 includes SAMT control logic 40, SAMT multiplexer logic 44, and SAMT registers 48 which are a set of storage locations (memory). FIG. 2 also shows tested module 1, CFG 12, and I/O 18. Internal detail is also shown of CFG 12; this detail includes SAMT control logic 40 connected between the SAMT registers 48 and the SAMT MUX logic 44 to the I/O 18 which includes output driver 52 driving output pin 56. and input driver 54 driven by input pin 58 and both connecting to module 1, and output driver 62 driving pin 66 and input driver 64 driven by input pin 68.

Figure 3:
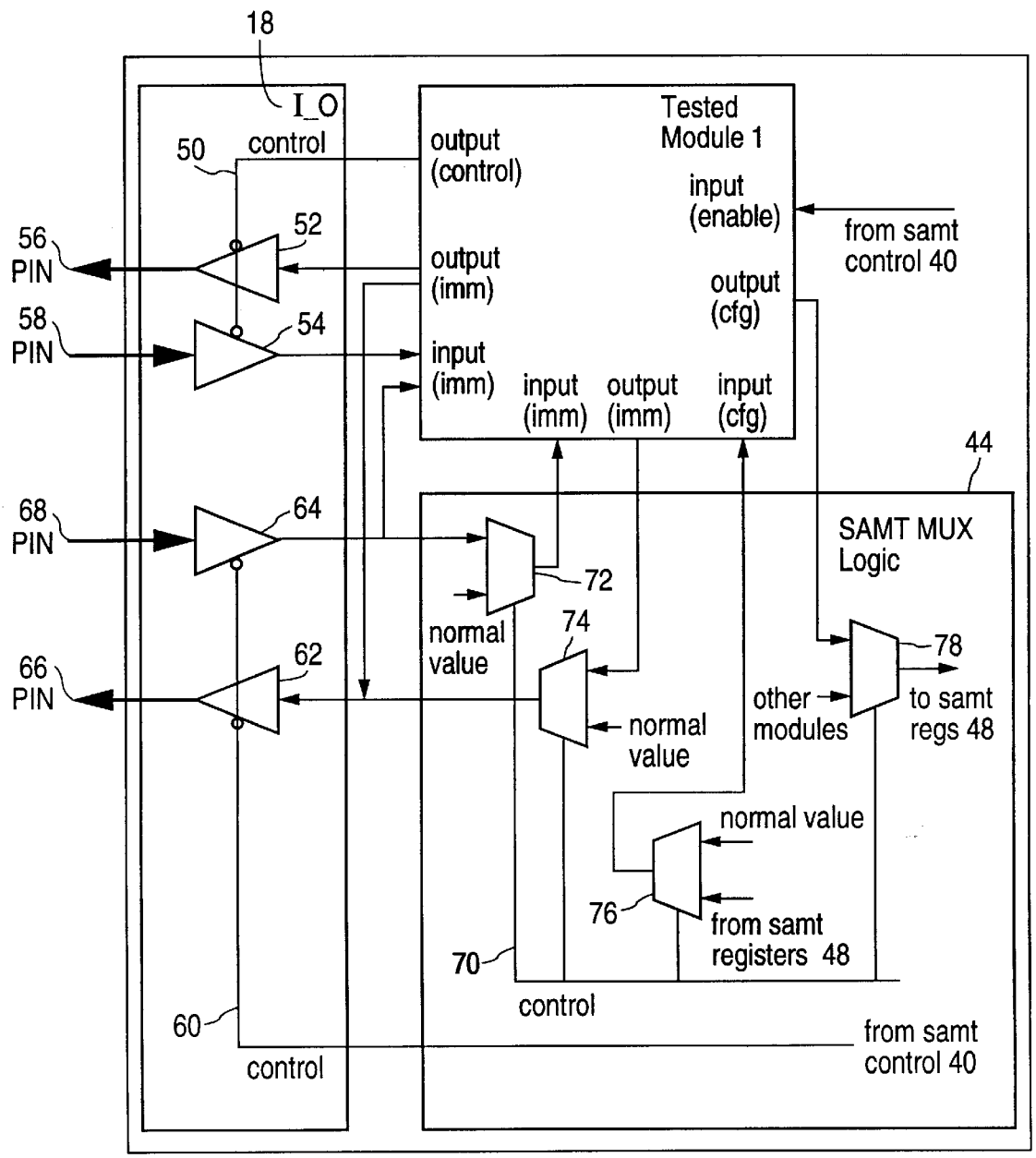
FIG. 3 shows details of the connections of a tested module of FIG. 2.

FIG. 3 shows elements of FIG. 2 in greater detail including the SAMT MUX logic 44, the module 1 under test and the I/O 18. The I/O 18 of the chip conventionally includes tristate output buffer 52 (also shown in FIG. 2) and the tristate input buffer 54 (also shown in FIG. 2). These buffers 52, 54, 62, 64 may be connected directly to the tested module or through the SAMT MUX logic 44. FIG. 3 shows the various imm and control signals described above being generated from and received by module 1 under test. The SAMT MUX logic 44 includes four kinds of selectors (multiplexers), each connected to the appropriate kind of the tested module interface signals. The other signals of the tested module use the normal interface with the I/O pins.

The first multiplexer 72 receives two input signals; the first input signal is the normal value (signal) for normal chip operation. The second input comes from the tristate buffer 64. When in normal operation mode, the normal value is selected. When module 1 is in SAMT mode, the input signal from pin 68 is selected and used as an immediate input signal to the tested module 1.

The second multiplexer 74 receives two output signals. The normal value is selected to be the output signal on pin 66 in normal operation mode. The immediate output signal imm of the tested module 1 is selected when SAMT mode is active.

The third multiplexer 76 receives two input signals. The normal value is selected to be the "CFG input" of the module in normal operation mode. The test value from the SAMT registers is selected to be the "CFG input" of the tested module 1 when SAMT mode is active.

The fourth multiplexer 78 receives the "CFG outputs" from all the chip modules and selects the CFG outputs from the tested module 1 to be sent to the SAMT registers 48.

Control signal 50 controls the I/O tristate buffers 52 and 54. Control signal 60 controls the I/O tristate buffers 62 and 64. Control signal 70 controls multiplexers 72, 74, 76 and 78. Control signal 80 (See FIG. 2) enables the tested module activity. Control signal 50 originates in the tested module 1 and its activity is the same for normal operation and SAMT mode.

Control signals 60, 70 and 80 originate in the SAMT control logic 40. When in SAMT mode, these control signals enable the tested modules and select its inputs and outputs.

The circuitry for supporting SAMT includes the following elements:
1. The SAMT_enable Bit enables the stand alone module testing mode. This bit may be located at any CFG register; generally, it will be located in the CFG test register (not a part of the SAMT logic.) This enable bit is accessed by the conventional protocol used to access all the configuration registers in such modularized chips. This enable bit is not affected by the reset operation, and should be cleared by the power-up reset or write operation.
2. SAMT registers 48 are dedicated to SAMT. These registers are accessible only when the SAMT_enable bit is set and using the SAMT_cs signal; see FIGS. 5 and 6 for the read/write protocols. The SAMT registers 48 include three types of registers:
   a. SAMT_module_enable registers used to specify the module being tested. An example of the organization of such a register is shown in FIG. 4A. Only one bit specifying one tested module is to be set, out of all the enable bits located in the registers of this type.
   b. SAMT_configuration registers used for driving the "CFG inputs" and for storing the "CFG outputs" of the module 1 being tested. An example of the organization of such a register is shown in FIG. 4B. These registers are shared between all the modules.
   c. SAMT_output registers used for storing the "CFG outputs" of the module being tested. The organization of such a register is identical to type b registers. These registers are shared between all the modules.

Figure 5:
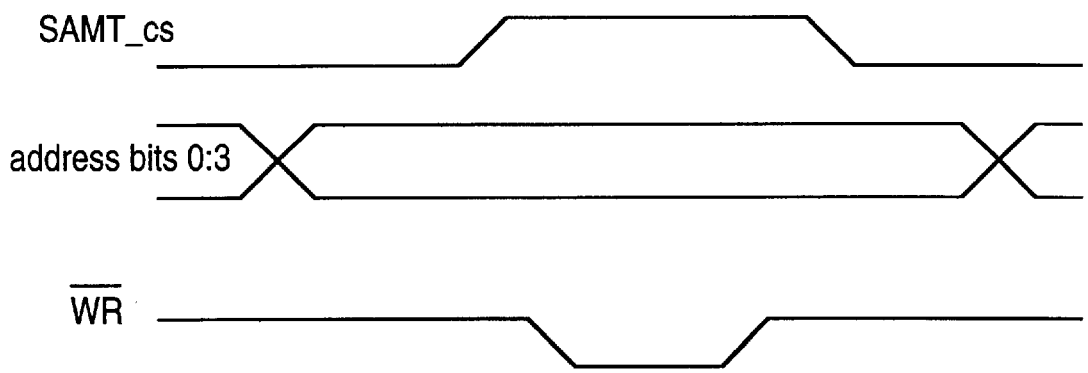
FIGS. 5 and 6 show respectively SAMT write and read timing diagrams.
Figure 6:
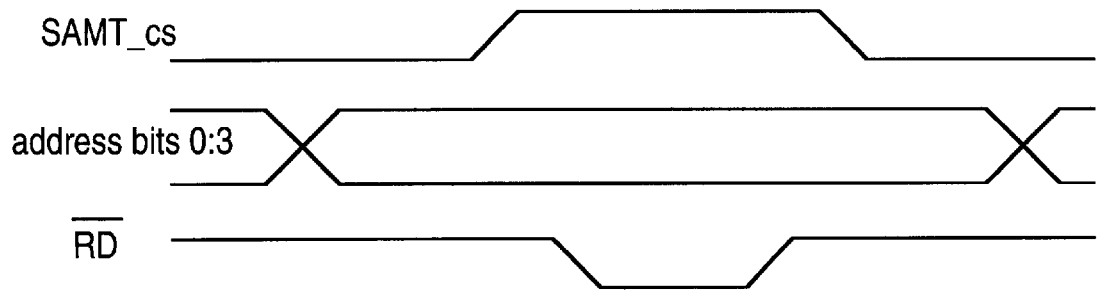

In SAMT mode, a standard read and write protocol is used for all read and write operations accessing either the SAMT registers or the internal modules' registers. One of the chip's pins is defined as "SAMT_cs" (SAMT chip select) in SAMT mode. (This is a case of a chip pin 68 as in FIG. 3 connected to a tristate input buffer 64 controlled by control signal 60, and selected by MUX 72 to be a chip_select input of either the tested module 1, or the SAMT registers.) The read/write SAMT protocol uses the SAMT_cs, together with conventional RD/WR/address/data interface signals, to access the SAMT registers and the tested module internal registers. Timing diagrams of these protocols are shown in FIG. 5 (Write) and FIG. 6 (Read).

The following chip design method is used to implement the SAMT environment:

In the CFG module, a set of registers are added: SAMT_module_enable registers, SAMT_output and SAMT_configuration registers.

A chip pin is allocated for the chip_enable signal to be used in all the SAMT read and write transactions.

For each module the following is done:
Provide a table (in text) containing the following information for each signal in the module interface:
 1. Signal name
 2. Signal direction: Input or Output to the module.
 3. Signal type: one of imm/CFG/control (as described above).
 4. For-a signal of the type "control", which module output signals it controls.

According to the table, do the following:
1. Allocate a bit in one of SAMT module enable registers for the module.
2. Identify all signals of the type "CFG input". For each of these signals, allocate a bit in one of the SAMT_configuration registers. Selectors (e.g. multiplexers) of type 76 are added to select between the normal value and a value from the SAMT_configuration registers (see FIG. 3).

3. Identify all signals of the type "CFG output". For each of these signals, allocate a bit in the register SAMT_output. One adds selectors of type 78 to select test or normal data between all the possible SAMT modules on the chip. The output of the selector is loaded into the allocated bits in the SAMT_output registers.
4. Identify all signals of the type "imm input". For each of these signals one specifies:
   a. If the signal is connected to a dedicated chip pin, then control line So and input buffer 54 are used.
   b. If the signal shares a chip pin with other functions, then control 60 and input buffer 64 drive the "imm input" of the module.
   c. If the signal is not connected to a chip pin, then one allocates a pin 68 and an input buffer 64 and adds selectors of type 72. The selector 72 selects between the normal value and the input-value of pin 68, to supply the tested module with the "imm input" value.
5. Identify all signals of type "imm output". For each of these signals one specifies:
   a. If the signal is connected to a dedicated chip pin, then control line 50 and output buffer 52 are used.
   b. If the signal shares a chip pin with other functions, then control 60 and output buffer 62 is driven by the "imm output" of the module 1.
   c. If the signal is not connected to a chip pin, then one allocates a pin 66 and an output buffer 62 and adds selectors of type 74. The selector 74 selects between the normal value and the "imm output" of the tested module to be driven through buffer 62 to chip pin 66.

The actual chip testing process (for a chip designed as described above) is as follows:
1. To invoke SAMT mode, a special chip test pattern is created, the "invoke_SAMT_pattern". This pattern contains the write operation into a CFG test register, for setting the SAMT_enable bit. Once that bit is set, the chip will be in the SAMT mode. At the end of this pattern, the reset signal is activated.

Since the write operation is chip dependent, this pattern is created for each chip.

When generating test vectors in the SAMT environment, one assumes the chip is already in stand alone test mode. While in SAMT mode, the module's patterns should include the following:
1. Configure all of the module's signals that are of type "CFG input" by writing to the SAMT_configuration registers, using the protocol shown in FIG. 5.
2. Drive by the test environment (written in any conventional simulation language) all the chip pins allocated for the module's "imm inputs".
3. Write to the SAMT_module_enable register, using the write protocol shown in FIG. 5, to enable the "stand alone" module.

The module under test is now in "stand alone" mode. The module's input signals can be directly controlled: imm type signals by changing the pin's value, and cfg type signals by writing to SAMT_configuration registers. The module's output signals are observable: imm type signals on a pin, control signals by observing its effect on the pin; CFG type signals by reading the contents of a SAMT_configuration register.

After test vectors are generated for a module design in the SAMT environment for a particular chip, then in order to use the same test vectors in new chips having the same design module, one does the following:
1. For all signals of imm type, check pin assignments (i.e. what I/O pin is connected to what imm type signal) as explained above.
2. Change the signal's name in the test vectors accordingly. For example, if in the test vector the chip select signal is connected to pin "y" but in the new chip it should be connected to a different pin "x", then the signal should be renamed to pin "x" in the new chip's pattern.
3. One runs the "Invoke_SAMT_pattern" once, to invoke SAMT mode. When exiting reset, the chip is in the SAMT mode.
4. Run all the required test vectors. Make sure the SAMT_enable signal is not cleared before all test vectors were run. If the SAMT_enable signal is cleared, then the SAMT mode should be invoked again.

This disclosure is illustrative and not limiting; further modifications will be apparent to one skilled in the art and are intended to fall within the scope of the appended claims.

We claim:

1. An integrated circuit having a plurality of circuit modules and a configuration module, the circuit modules each being connected to the configuration module and not being directly connected to one another, the configuration module comprising:
   a) a plurality of test registers;
   b) a selector portion having a plurality of selectors connected to the test registers; and
   c) control circuitry coupled to the selector portion thereby controlling the selectors and thereby configuring the selectors for testing each circuit module.

2. The integrated circuit of claim 1, wherein the control circuitry is coupled to the circuit modules for disabling all but one of the circuit modules during testing of the integrated circuit.

3. The integrated circuit of claim 1, wherein the control circuitry upon the exiting of a reset state of the integrated circuit, configures the integrated circuit into a test mode.

4. The integrated circuit of claim 1, wherein the control circuitry is coupled to input and output buffers of the integrated circuit thereby enabling and disabling the input and output buffers during testing.

5. The integrated circuit of claim 1, wherein the integrated circuit is in one of a test mode or an operating mode.

6. The integrated circuit of claim 1, further comprising a plurality of input buffers and output buffers coupled to each of the circuit modules, wherein in the test mode of the integrated circuit at least one input buffer and at least one output buffer are enabled or disabled.

7. The integrated circuit of claim 6, wherein the input and output buffers are configured by a circuit module.

8. The integrated circuit of claim 1, wherein the configuration module is configured by signals from one of the circuit modules.

9. A plurality of integrated circuits, each having a plurality of circuit modules, at least one of the integrated circuits having a plurality of circuit modules and a configuration module, the circuit modules in the one of the integrated circuits each being connected to the configuration module and not being directly connected to one another, the configuration module comprising:
   a) a plurality of test registers;
   b) a selector portion having a plurality of selectors connected to the test registers; and
   c) control circuitry coupled to the selector portion thereby controlling the selectors and thereby configuring the selectors for testing each circuit module in the one of integrated circuits; and
   wherein each of the circuit modules in the one of the integrated circuits is of identical design to a circuit module in another of the integrated circuits.

* * * * *